Aug. 27, 1974 W. T. LYNCH 3,832,246

METHODS FOR MAKING AVALANCHE DIODES

Filed May 22, 1972

United States Patent Office 3,832,246
Patented Aug. 27, 1974

3,832,246

METHODS FOR MAKING AVALANCHE DIODES

William Thomas Lynch, Summit, N.J., assignor to Bell Telephone Laboratories, Incorporated, Murray Hill, N.J.

Filed May 22, 1972, Ser. No. 255,575
Int. Cl. H01l 5/00, 7/36, 7/44
U.S. Cl. 148—175 10 Claims

ABSTRACT OF THE DISCLOSURE

Edge breakdown in an epitaxial avalanche photodiode is eliminated by using the mesa etch technique to define the active device, and then doping the mesa sidewalls to a relatively high resistivity with impurities of the substrate conductivity type. In one embodiment, deposited silicon dioxide surrounds the mesa to give a planar external configuration; and in another embodiment, anisotropic etching of the mesa produces a vertical sidewall against which incident light may be directed.

Background of the Invention

This invention relates to the fabrication of semiconductor devices including a junction to be operated in avalanche breakdown. The invention has specific application to the fabrication of avalance photodiodes used as detectors of high frequency modulated light beams.

Conventional avalanche diodes have a diffused p-n junction which is planar in a central portion but which curves upwardly at its edges to the device surface. During operation, undesired electric field concentrations at the curved portion of the junction cause local erratic avalanche breakdown. Numerous prior art techniques for preventing such undesirable edge breakdown are described in the patent of W. T. Lynch No. 3,514,846 issued June 2, 1970 and assigned to Bell Telephone Laboratories, Incorporated.

After discussing the drawbacks of various prior art techniques, the Lynch patent teaches that edge breakdown can be avoided by epitaxially growing a relatively high resistivity layer over a relatively low resistivity substrate to form the p-n junction, and then defining the diode region by diffusing through the epitaxial layer impurities of the substrate conductivity type. The diffused region, which gives diffusion isolation of the diode, is of a higher resistivity than the substrate, and is therefore not susceptible to breakdown. For reasons explained in detail in the patent, this structure is more effective than previous techniques in restricting avalance breakdown to the central planar portion of the diode junction.

It has been found, however, that the diffusion isolation required in the technique of the Lynch patent creates other problems and drawbacks. For example, the diode must be subjected to a fairly high temperature for a relatively long time period to diffuse impurities through the epitaxial layer beyond its junction with the substrate. This processing tends to degrade the planar junction by making it less abrupt, which in turn reduces the gain-bandwidth capabilities of the device. In other words, the junction tends to become more "graded" which reduces its available gain at high frequencies, thereby reducing its potential usefulness as an optical detector.

Summary of the Invention

It is an object of this invention to increase the ease with which dependable avalanche diodes may be made.

It is another object of this invention to increase the gain-bandwidth capabilities of avalanche photodiodes.

These and other objects of the invention are attained in an illustrative embodiment in which photodiodes are made, first, by epitaxially growing a relatively high resistivity layer on a relatively low resistivity substrate in a manner described in the aforementioned Lynch patent. Rather than delimiting the extent of the junction by isolation diffusion, however, individual diodes are defined by mesa etching. That is, all but selected portions of the epitaxial layer are dissolved by the selective etching to leave an array of mesas each defining a diode. Impurities of the same conductivity type as the substrate are then diffused into the sidewalls of the mesa and the upper surface of the substrate. As will become clear hereinafter, this yields a diode structure which is electrically the equivalent of the device of the Lynch patent, except that the problem of junction grading is avoded because only a very shallow diffusion is required for preventing edge breakdown.

In accordance with another embodiment, the mesa etched devices are made of silicon and silicon dioxide is selectively grown to a level flush with the top of each mesa. A shallow diffusion into the mesa sidewalls can then be made merely by exposing the structure to vaporized gallium, which, as is known, will diffuse through the silicon dioxide and will thereafter diffuse into the mesa sidewalls.

In accordance with another embodiment, known anisotropic etching techniques, with appropriate orientation of the semiconductor substrate, are used for etching a mesa having walls that are perpendicular to the avalanche junction. Incident light is directed against the perpendicular mesa sidewalls for efficiently producing avalanche breakdown along the length of the planar junction. This embodiment is particularly useful for detecting light of a relatively long wavelength which tends to penetrate a substantial distance into the semiconductor.

These and other objects, features and advantages of the invention will be better understood from a consideration of the following detailed description taken in conjunction with the accompanying drawings.

Drawing Description

Detailed Description

Figure 1:
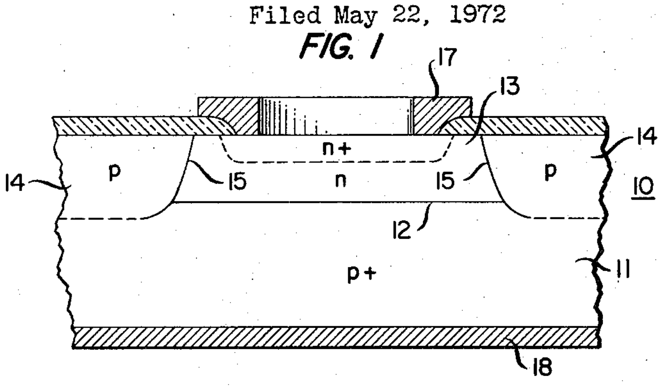
FIG. 1 is a schematic sectional view of an avalanche diode of the prior art.

Referring now to FIG. 1 there is shown an avalanche photodiode 10 of the prior art comprising a monocrystalline silicone substrate 11 of a relatively low resistivity p-type material, which forms a planar junction 12 with a layer 13 of relatively high resistivity n-type material. The junction 12 is surrounded by a diffused isolation region 14 which forms a junction 15 with the layer 13. Because substrate 11 is of a lower resistivity than that of diffused isolation region 14, avalanche breakdown occurs preferentially along planar junction 12 rather than along the curved junction 15.

The purpose of the FIG. 1 structure is, of course, to restrict avalanche breakdown to the planar junction 12, and to accomplish this, it is essential that isolation region 14 be diffused to a depth below that of junction 12, as shown. However, this requires that the entire structure be exposed to a high temperature for a relatively long period of time, which tends to degrade the junction 12. Specifically, it is desirable to have an abrupt junction, which can be readily achieved by epitaxially growing the layer 13 over substrate 11; but this advantage is lost if the high diffusion temperature reduces the junction abruptness.

After diode formation, contacts 17 and 18 are applied for biasing the diode near the avalanche threshold voltage. Light incident through contact 17 causes breakdown over the entire junction 12, which constitutes both detection and amplification of the photocurrent produced by the light. The quality of such photodiodes is sometimes measured by the product of gain and bandwidth, known as gain-bandwidth, which depends, among other things, upon the abruptness of junction 12. Since the junction abruptness deteriorates during diffusion of regions 14 as mentioned before, the gain-bandwidth of device 10, with typical dopant impurities in silicon, may be approximately 10 gigahertz.

Figure 2:
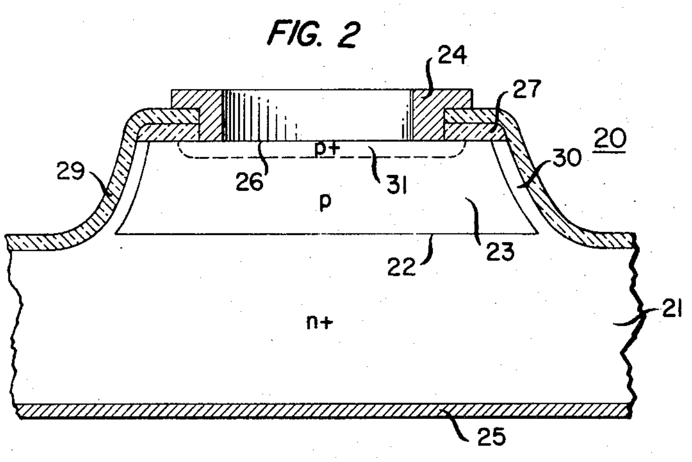
FIG. 2 is a schematic sectional view of an avalanche diode in accordance with one embodiment of the invention.

In accordance with the present invention, many of the problems associated with fabrication of the FIG. 1 device are avoided through the fabrication of device 20 of FIG. 2. Device 20 operates in the same manner as that of FIG. 1; that is, substrate 21 forms with layer 23 and junction 22 which is biased by contacts 24 and 25. Avalanche breakdown is caused by light impinging through contact 24. The conductivities are shown to be opposite those of FIG. 1 merely to indicate that, in both cases, conductivities complementary to those shown may alternatively be used.

As with the FIG. 1 device, device 20 is fabricated first by epitaxially growing the relatively high resistivity layer 23 over the relatively low resistivity substrate. The diode, however, is defined by mesa etching rather than by isolation diffusion. To do this, part of upper surface 26 of layer 23 is masked by a layer 27 of silicon nitride, only part of which is shown. That portion of the layer not masked by layer 27 is dissolved by an appropriate etchant to form the mesa structure having sloping sidewalls as shown. Next, the entire structure is covered with a thin layer of silicon dioxide 29 doped with an appropriate n-type material. The n-type material from layer 27 diffuses in a known manner into the mesa sidewalls to form a thin n-type layer 30 which is lightly-doped, or of a relatively higher resistivity than the substrate 21 (but of a lower resistivity than layer 23). This diffusion, which extends into the mesa for a distance of less than one micron, may be made, in a known manner, at a relatively low temperature so as not to disrupt in any manner the abrupt planar junction 22. Thereafter, portions of layers 27 and 29 along the top of the mesa may be etched in a known manner to provide for the formation of contact 24. A local low resistivity region 31 is typically made to provide good electrical contact between contact 24 and layer 23.

FIGS. 1 and 2 show that the devices are electrically comparable in that edge breakdown is prevented by a high resistivity region surrounding the planar junction and being of the same conductivity type as that of the substrate. In fact, the only substantial electrical difference between the two devices results from the fact that the device of FIG. 2 can be made with an abrupt junction 22 because no deep diffusions are required for preventing edge breakdown as in FIG. 1.

The substrate 21 may be doped to a carrier concentration of $5\times10^{17}$ carriers per cubic centimeter, with p-type epitaxial layer 23 being doped to a carrier concentration of $10^{16}$ carriers/cm.$^3$ N-doped silicon dioxide layer 29 may be 5,000 angstroms thick and it may be heated at 900°–1000° C. for less than an hour to produce a shallow diffused layer 30 approximately 0.2 to 0.3 microns thick with an n-type carrier concentration of $3\times10^{16}$ carriers/cm.$^3$ Epitaxial layer 23 may be approximately 3 microns thick with contact 24 being 5,000 angstroms thick to give efficient light penetration into the region of planar junction 22. With these parameters, gain-bandwidths on the order of 100 gigahertz are obtainable. Normally, a large number of diodes will be formed on a single wafer with subsequent dicing, in the usual manner, forming the individual devices.

One possible drawback of the configuration of FIG. 2 is that the upper surface is not flat, which may make it difficult to form dependable leads to contact 24 by integrated circuit techniques. Further, because upper surface 26 may be very small, for a low capacitance photodiode application, it may be difficult to leave a sufficiently large contact area for making external circuit connections.

Figure 3:
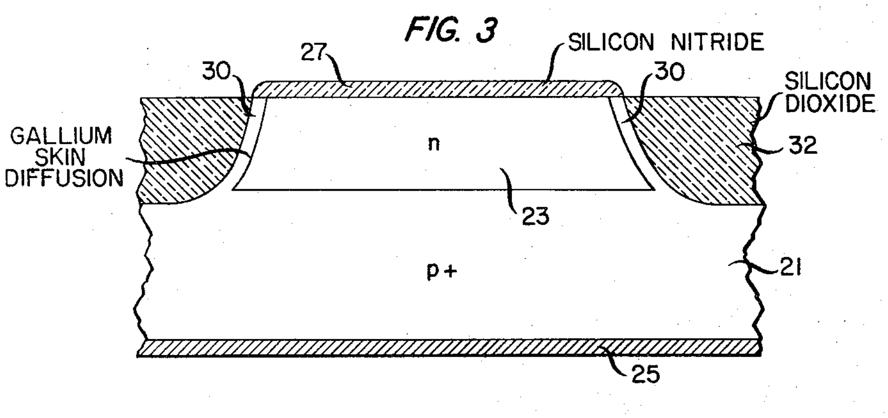
FIG. 3 is a schematic sectional view of an avalanche diode in accordance with another embodiment of the invention.

FIG. 3 shows how the structure may be improved by "back-filling" the region around the mesa with a relatively thick layer of silicon dioxide 32. The oxide layer 32 may be grown to a depth of 3 microns by the known technique of exposure to an oxygen rich atmosphere such as water vapor. The mesa etch in this embodiment need not reach the substrate junction, since the growing silicon dioxide will consume the underlying silicon and will therefore complete the "etching" process. The shallow layer 30 may then be made by exposing the structure to gallium vapor at approximately 1000° C. for 30 minutes, which, as is known, will readily penetrate silicon dioxide and will diffuse into the silicon. A contact to the upper surface of layer 23 may then be made as described before with substantially flush horizontal leads extending along the silicon dioxide layer 32. The horizontal lead (or contact pad) does not have a mesa step to traverse, and, since it is over a relatively thick region of insulating silicon dioxide, it does not contribute significantly to the device capacitance.

Figure 4:
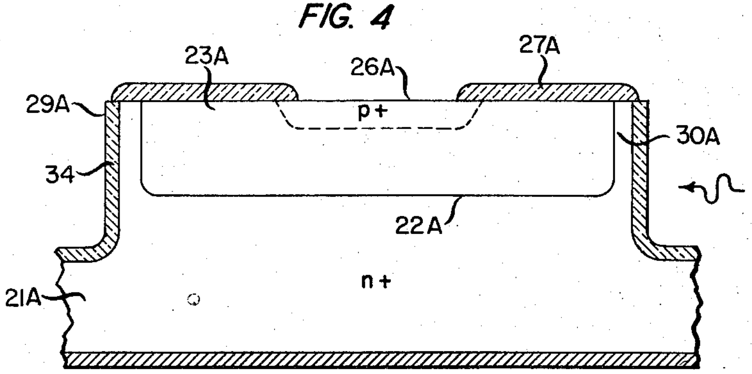
FIG. 4 is a schematic sectional view of an avalanche diode in accordance with still another embodiment of the invention.

By the use of anisotropic silicon etching, the junction plane can be made perpendicular to the etched surface as shown in FIG. 4. As is known, by forming the substrate 21A and epitaxial layer 23A such that upper surface 26A lies in the 110 crystallographic plane, exposure of the crystal to an appropriate etchant will result in an etched surface 34 which is perpendicular to surface 26A. This surface may be covered with a doped oxide 29A for producing shallow diffused n-type layer 30A as described before. The various doping and dimension parameters may be the same as those described before, except that it is preferred that epitaxial layer 23A be on the order of 10 microns thick since light is incident at a different location.

The virtue of this embodiment is that incident light may be directed at the edge of the junction as indicated by the arrow and thereby interact with the junction carriers over a large distance of penetration. For example, light from the 1.06 micron YAG laser has a low absorption coefficient in silicon and will penetrate a relatively large distance into it. In this embodiment, the incident light is absorbed in the active junction region over its entire absorption distance and has a much higher detection efficiency than with the illumination perpendicular to the junction.

In summary, numerous embodiments have been described in which edge breakdown of an avalanche diode is precluded with the same effectiveness as that of the foregoing Lynch patent, while avoiding any disadvantageous deep diffusions into the diode structure. Rather, mesa etching together with a shallow diffusion has been found to give the same electrical advantages. Other features have been described for giving optimum configurations to facilitate integrated circuit fabrication, and to maximize efficient detection of relatively long wavelength light. While silicon is favored in the implementation of the invention, it is to be understood that materials, conductivities, dimensions, and parameters other than those specifically described can alternatively be used.

Various other embodiments and modifications may be made by those skilled in the art without departing from the spirit and scope of the invention.

What is claimed is:

1. A method for making an avalanche diode comprising the steps of:

forming an epitaxial layer of a first conductivity type over a substrate of a second conductivity type opposite the first conductivity type, the epitaxial layer having a sufficiently high resistivity with respect to the substrate to permit avalanche breakdown operation;

masking the layer;

etching through the unmasked portion of the layer to form a mesa configuration;

increasing the voltage threshold of avalanche breakdown at the edges of the junction comprising the step of diffusing material of the second conductivity type into the sidewalls of the mesa;

and providing electrode means for producing an avalanche breakdown of the junction in response to light impingement, whereby the diode may be operated as a photodiode.

2. The method of claim 1 wherein:

the diffusing step comprises the step of diffusing sufficient material of the second conductivity type to convert the sidewalls of the mesa to the second conductivity type, but to a significantly higher resistivity than that of the substrate.

3. The method of claim 2 wherein:

the substrate and epitaxially grown layer are of silicon and the diffusing step comprises the step of forming a layer of silicon dioxide doped with material of the second conductivity type over the entire mesa configuration, and permitting material of the second conductivity type to diffuse into the mesa sidewalls.

4. The method of claim 2 further comprising the step of:

forming sufficient silicon dioxide over the substrate to substantially replace the material removed by etching, thereby to make the upper surface of the mesa configuration substantially flush with the upper surface of the deposited silicon dixoide.

5. The method of claim 4 wherein:

the diffusion step comprises the step of exposing the mesa configuration to vaporized gallium at a sufficient temperature to cause it to penetrate through deposited silicon dioxide into the sidewalls of the mesa.

6. The method of claim 2 wherein:

the diffusion step is a skin diffusion type.

7. The method of claim 6 wherein:

the diffusion step comprises the step of diffusing material into the sidewalls of the mesa to a depth of less than about one micron.

8. The method of claim 2 wherein:

the etching step comprises the step of anisotropic etching to form a mesa sidewall which is substantially perpendicular to the junction.

9. The method of claim 8 wherein:

the substrate and epitaxially grown layer are of silicon and the growing step comprises the step of epitaxially growing the layer such that an upper surface thereof lies in the 110 crystallographic plane, thereby facilitating anisotropic etching of a sidewall that is perpendicular to the junction.

10. A method for making an avalanche diode comprising the steps of:

orienting a relatively low resistivity silicon substrate of a first conductivity such that an upper surface thereof lies in the 110 crystallographic plane;

epitaxially growing a layer of a second conductivity on said upper surface, hereby to form a p-n junction, said layer having a higher resistivity than the substrate and a conductivity type opposite that of the subtrate;

masking part of the upper surface of the epitaxial layer;

anisotropically etching the unmasked portion of the epitaxial layer through the upper surface of the substrate, thereby to form a mesa structure having sidewalls perpendicular to the junction;

covering the sidewall with a thin transparent layer of oxide doped to be of the first conductivity type;

heating the structure to diffuse impurities of the first conductivity type into the mesa sidewall;

and applying electrodes of a type sufficient to produce avalanche breakdown in the junction in response to light impingement, whereby light incident on the perpendicular sidewall is capable of traveling along the junction thereby to cause avalanche breakdown along a substantial length of the junction.

References Cited

UNITED STATES PATENTS

| | | | |
|---|---|---|---|
| 3,491,434 | 1/1970 | Cunningham et al. | 148—175 X |
| 3,514,846 | 6/1970 | Lynch | 29—572 |
| 3,405,329 | 10/1968 | Loro et al. | 317—234 |
| 3,718,843 | 2/1973 | Kooi | 317—235 |
| 3,332,143 | 7/1967 | Gentry | 148—175 X |
| 3,445,303 | 5/1969 | Engbert | 148—187 |
| 3,463,681 | 8/1969 | Winstel et al. | 317—235 X |
| 3,465,159 | 9/1969 | Stern | 317—235 AK |
| 3,489,958 | 1/1970 | Gramberg et al. | 148—175 X |
| 3,649,386 | 3/1972 | Murphy | 317—235 AK |

FOREIGN PATENTS

| | | | |
|---|---|---|---|
| 232,390 | 4/1969 | U.S.S.R. | 317—235 AK |

OTHER REFERENCES

Bean et al., "Influence of Crystal Orientation on Silicon . . . Processing," Proc. IEEE, vol. 57, No. 9, September 1969, pp. 1469–1476.

Michelitsch, M., "Light-Emitting GaAs Diode," IBM Tech. Discl. Bull., vol. 8, No. 11, April 1966, pp. 1662–63.

Peltzer et al., "Isolation Method . . . Dense Memories," Electronics, Mar. 1, 1971, pp. 52–55.

Appels et al., "Local Oxidation of Silicon . . . Technology," Philips Res. Repts., vol. 25, April 1970, pp. 118–132.

L. DEWAYNE RUTLEDGE, Primary Examiner

W. G. SABA, Assistant Examiner

U.S. Cl. X.R.

29—572, 580; 148—187; 317—235 R